United States Patent
Fukiage

(10) Patent No.: US 6,801,460 B2
(45) Date of Patent: Oct. 5, 2004

(54) SEMICONDUCTOR MEMORY DEVICE SUPPRESSING PEAK CURRENT

(75) Inventor: Takahiko Fukiage, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/654,948

(22) Filed: Sep. 5, 2003

(65) Prior Publication Data
US 2004/0160842 A1 Aug. 19, 2004

(30) Foreign Application Priority Data
Feb. 19, 2003 (JP) .................................... 2003-041199

(51) Int. Cl.⁷ .................................................. G11C 7/00
(52) U.S. Cl. ....................... 365/191; 365/205; 365/208; 365/230.03
(58) Field of Search ............... 365/230.03, 191, 365/205, 207, 208, 222

(56) References Cited

U.S. PATENT DOCUMENTS

| | | | | |
|---|---|---|---|---|
| 4,912,678 A | * | 3/1990 | Mashiko | 365/222 |
| 4,916,671 A | * | 4/1990 | Ichiguchi | 365/233 |
| 5,251,176 A | * | 10/1993 | Komatsu | 365/222 |
| 5,644,773 A | * | 7/1997 | DiMarco | 365/226 |
| 5,999,471 A | * | 12/1999 | Choi | 365/222 |
| 6,256,244 B1 | * | 7/2001 | Kim | 365/203 |

FOREIGN PATENT DOCUMENTS

| | | |
|---|---|---|
| JP | 63-50998 | 3/1988 |
| JP | P2001-167580 A | 6/2001 |

* cited by examiner

*Primary Examiner*—Son Mai
(74) *Attorney, Agent, or Firm*—McDermott Will & Emery LLP

(57) ABSTRACT

In a semiconductor memory device including a plurality of memory chips, the plurality of memory chips are divided into first and second groups that are operated in parallel with each other at the time of a data read. Timings of activating sense amplifiers belonging to the first and second groups are made different from each other. Accordingly, the maximum value of peak current generated when the sense amplifiers are activated at the time of a data read is reduced by half in the semiconductor memory device as a whole. As the peak current is suppressed, the data reading operation can be executed stably.

4 Claims, 18 Drawing Sheets

SEMICONDUCTOR MEMORY DEVICE SUPPRESSING PEAK CURRENT

BACKGROUND OF THE INVENTION

1. Field of the Invention

The present invention relates to a semiconductor memory device represented by a memory module having a plurality of memory chips mounted on one board.

2. Description of the Background Art

MOS type semiconductor memory devices, particularly DRAMs (Dynamic Random Access Memory) come to have ever increasing storage capacity along with the development of miniaturization techniques. As the storage capacity of DRAMs increases, there arises stronger demand for higher speed of data processing, that is, demand for data processing of multiple bits in parallel by the memory chip.

In a configuration executing such multiple-bits data processing, it is necessary that a plurality of internal circuits operate in parallel, and as the number of data to be processed increases, current consumption, particularly peak current value becomes excessively large. This results in increased burden on power supply system that drives the circuits, possibly causing a circuit malfunction derived from fluctuation of power supply voltage. Japanese Patent Laying-Open No. 2001-167580 discloses a method of suppressing the peak current as a cause of malfunction, when multiple bits of data are to be processed simultaneously, for example, when two sense amplifiers are to be activated simultaneously at the time of a data read, by shifting the activation timings.

Recently, a memory module has been attracting attention, which realizes larger storage capacity by mounting a plurality of memory chips on one board, along with miniaturization. This is effective in that a large amount of information can be stored and in that multiple bits of data can be processed at high speed as the plurality of memory chips operate independently and in parallel with each other.

In this memory module also, each of the plurality of memory chips operate in parallel simultaneously, and therefore, the peak current of the memory module as a whole increases, as in the case described above.

SUMMARY OF THE INVENTION

The present invention was made to solve the above described problem, and its object is to provide a semiconductor memory device that realizes stable circuit operation without causing any malfunction, by suppressing the peak current.

The semiconductor memory device in accordance with the present invention includes a plurality of memory chips formed on one board, each executing data storage independently, and operating in a parallel. The plurality of memory chips are divided into first and second groups. Each of the memory chips includes a memory array, a precharge circuit, a sense amplifier, a preamplifier, an output buffer, an activation signal generating unit. The memory array has a plurality of memory cells arranged in a matrix of rows and columns, and a plurality of bit lines corresponding to memory cell columns. The precharge circuit is rendered activate before data reading to precharge the bit lines to a-prescribed voltage. The sense amplifier is rendered activate at the time of the data reading to amplify data stored in a plurality of memory cells. The preamplifier is rendered activate at the time of the data reading to further amplify the data that has been amplified by the sense amplifier. The output buffer is rendered activate at the time of the data reading to output the stored data amplified by the preamplifier. The activation signal generating unit generates an activation signal based on a command input for activating at least one of the precharge circuit, the sense amplifier, the preamplifier, and the output buffer. The activation signal generating unit includes a common activation signal generating circuit, a group determination circuit, and a timing control circuit. The common activation signal generating circuit generates a common activation signal based on the command input at the same timing independent of which group each memory chip belongs to. The group determination circuit generates a group determination signal for determining which group the memory chip belongs to. The timing control circuit receives the group determination signal and the common activation signal and generates the activation signal at the timing corresponding to the belonging group of the memory chip.

As described above, in the semiconductor memory device including a plurality of memory chips according to the present invention, the activation signal for activating at least one of the precharge circuit, the sense amplifier, preamplifier, the output buffer is generated at the timing in accordance with a group determining signal determining the belonging group of the memory chip. Accordingly, the maximum value of the peak current that is generated when the these circuits are activated is reduced by half in the entire semiconductor memory device. As the peak current is suppressed, stable operation of the circuits becomes possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
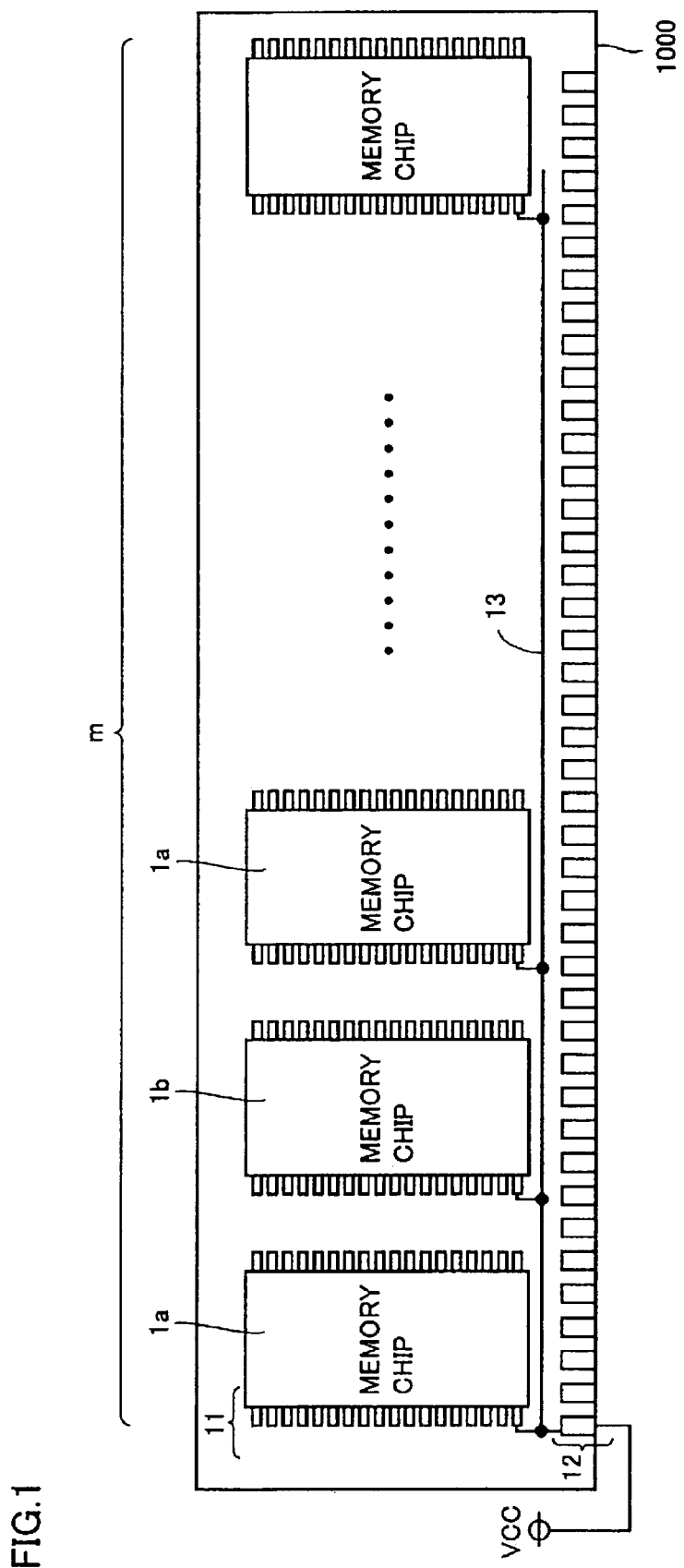
FIG. 1 is a schematic block diagram representing a configuration of a memory module in accordance with the first embodiment of the present invention.

Embodiments of the present invention will be described in detail with reference to the figures. In the figures, the same or corresponding portions are denoted by the same reference characters, and description thereof will not be repeated.

First Embodiment

Referring to FIG. 1, a memory module 1000 in accordance with the first embodiment of the present invention represents a semiconductor memory device having a plurality of memory chips 1a, 1b on one board. In the present embodiment, m/2 memory chips 1a and m/2 memory chips 1b are mounted.

Memory module 1000 includes a group of connecter terminals 12 used for data input/output and signal transmission/reception of respective memory chips 1a(1b). In accordance with various control signals and the like input to the group of connector terminals 12, m memory chips operate in parallel with each other.

Memory chips 1a and 1b have a group of external pins 11 connected to the group of connector terminals 12 and used for control signal input and data input/output.

By way of example, FIG. 1 shows a configuration in which a power supply voltage VCC is connected to one connector terminal of connector terminal group 12, and through a power supply line 13 arranged common to each of the memory chips, connected to one external pin of external pin group 11 of each memory chip, to supply the power supply voltage VCC to each memory chip as an operational voltage.

The configuration is the same for other connector terminals, and control signals and the like input to the connector terminals are input through external pins of each of the memory chips 1a (1b).

Figure 2:
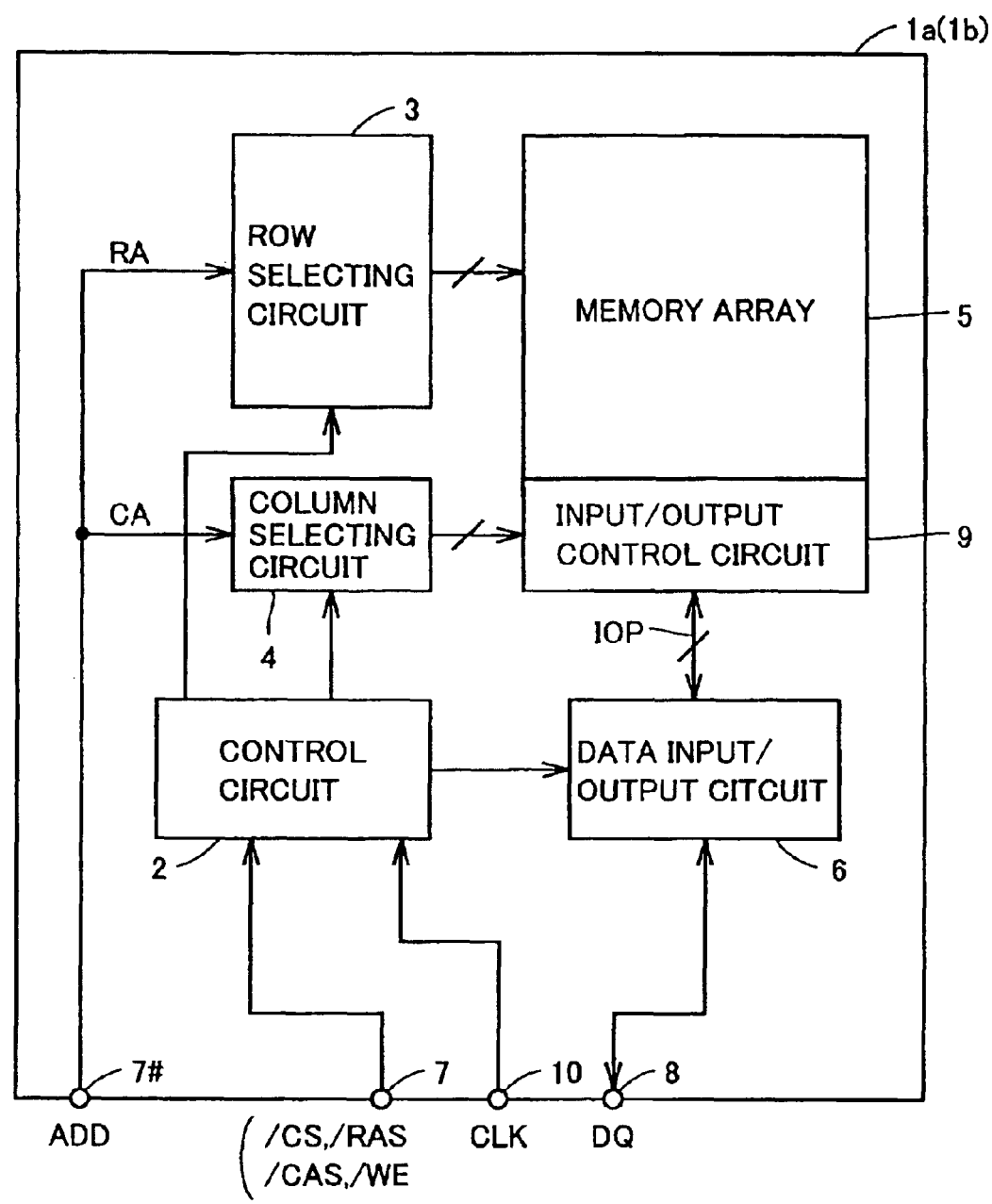
FIG. 2 is a schematic block diagram of a memory chip in accordance with the first embodiment of the present invention.

Referring to FIG. 2, memory chip 1a in accordance with the first embodiment of the present invention includes a memory array 5 arranged integrated in a matrix of rows and columns, a row selecting circuit 3 executing selection of a row of memory cell array 5 based on a row address RA among addresses ADD input through an address pin #7, which is one of the group of external pins 11, a column selecting circuit 4 executing selection of a column of memory cell array 5 based on a column address CA among the addresses ADD, an input/output control circuit 9 electrically coupling the selected column of memory array 5 to an input/output line pair IOP based on the result of column selection by column selecting circuit 4, a data input/output circuit 6 executing data communication between input/output line pair IOP and input/output pins 8, and a control circuit 2 controlling memory chip 1a as a whole in accordance with various control signals.

Control circuit 2 outputs command signals and various control signals to internal circuits existing in the chip, based on various control signals (/CS, /RAS, /CAS, /WE) input through control signal pin 7 and on a clock signal CLK input through a dock signal pin 10.

Figure 3:
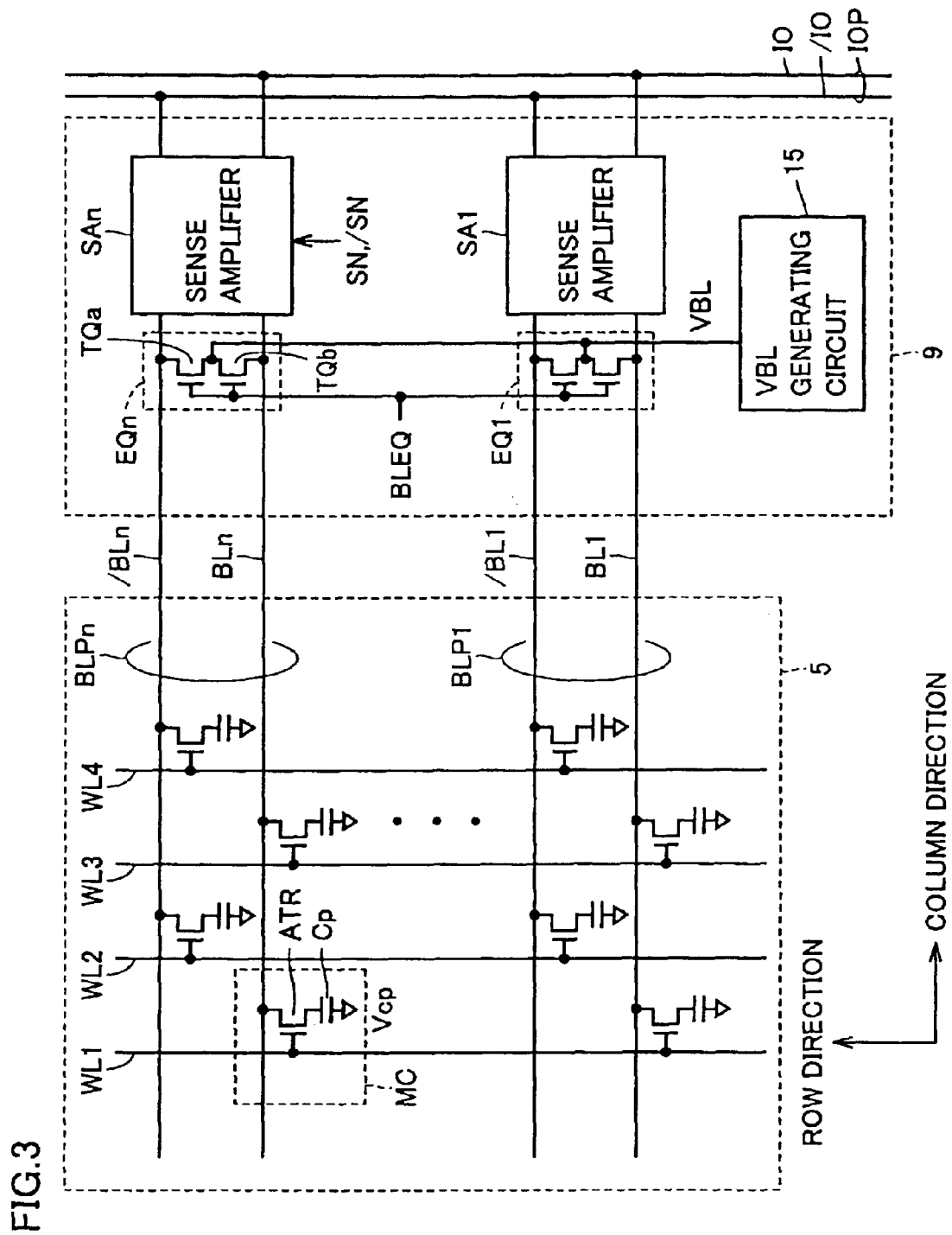
FIG. 3 is a circuit diagram of a memory array and an input/output control circuit in accordance with the first embodiment of the present invention.

Referring to FIG. 3, memory array 5 in accordance with the first embodiment has a plurality of memory cells MC arranged integrated in a matrix of rows and columns. Further, memory array 5 includes a plurality of word lines WL provided corresponding to the rows of memory cells respectively, and a plurality of bit line pairs BLP provided corresponding to sets of memory cell columns respectively, with adjacent two columns of memory cells constituting one set of memory cell columns. The bit line pair BLP includes a bit line BL provided for one memory cell column and a bit line IBL provided for the other memory cell column.

Each memory cell MC includes an access transistor ATR and a capacitor Cp. Access transistor ATR and capacitor Cp are arranged in series between a bit line BL and a cell plate voltage Vcp, and access transistor ATR has its gate electrically coupled to the corresponding word line WL.

In response to activation of the corresponding word line WL, capacitor Cp and bit line BL are electrically coupled. By charging or discharging capacitor Cp, data of 1 bit can be stored.

In this example, word lines WL1 to WL4 provided corresponding to the rows of memory cells and bit line pairs BLP1 to BLPn (n: natural number) provided corresponding to the sets of memory cell columns are shown.

Memory cells MC corresponding to odd-numbered word lines WL1 and WL3 are electrically coupled to bit line BL, and memory cells MC corresponding to even-numbered word lines WL2 and WL4 are electrically coupled to complementary bit line /BL. Here, word line WL, bit line pair BLP and bit lines BL and /BL generally represent a plurality of word lines, a plurality of bit line pairs and a plurality of bit lines. In the present specification, the sign "/" represents an inversion, negation, a complementary state or the like.

The configuration of input/output control circuit 9 will be described.

Input/output control circuit 9 includes a VBL generating circuit 15 for precharging the bit line pair BLP to a VBL voltage level (=VCC/2), and a plurality of equalizing circuits EQ1 to EQn (hereinafter also generally referred to as equalizing circuit EQ) and a plurality of sense amplifiers SA1 to SAn (hereinafter also generally referred to as sense amplifier SA), provided corresponding to bit line pairs BLP1 to BLPn, respectively.

Equalizing circuit EQ has transistors TQa and TQb connected in series between bit line BL and the complementary bit line /BL of the bit line pair BLP.

Connection nodes of transistors TQa and TQb are electrically coupled to VBL generating circuit 15 generating the voltage VBL. Further, transistors TQa and TQb receive at their gates an input of control signal BLEQ. For example, in response to the input of the control signal BLEQ ("H" level), transistors TQa and TQb of each equalizing circuit EQ turn on, and each bit line pair BLP is precharged to the level of voltage VBL. By way of example, transistors TQa and TQb are N channel MOS transistors.

Sense amplifier SA amplifies the voltage levels of bit line BL and the complementary bit line /BL in response to an input of control signals SN ("H" level) and /SN ("L" level), and at the time of a data read, transmits the amplified data signal to input/output line pair IOP. Input/output line pair IOP includes input/output lines IO and /IO, to each of which the amplified data signal is transmitted.

Figure 4:
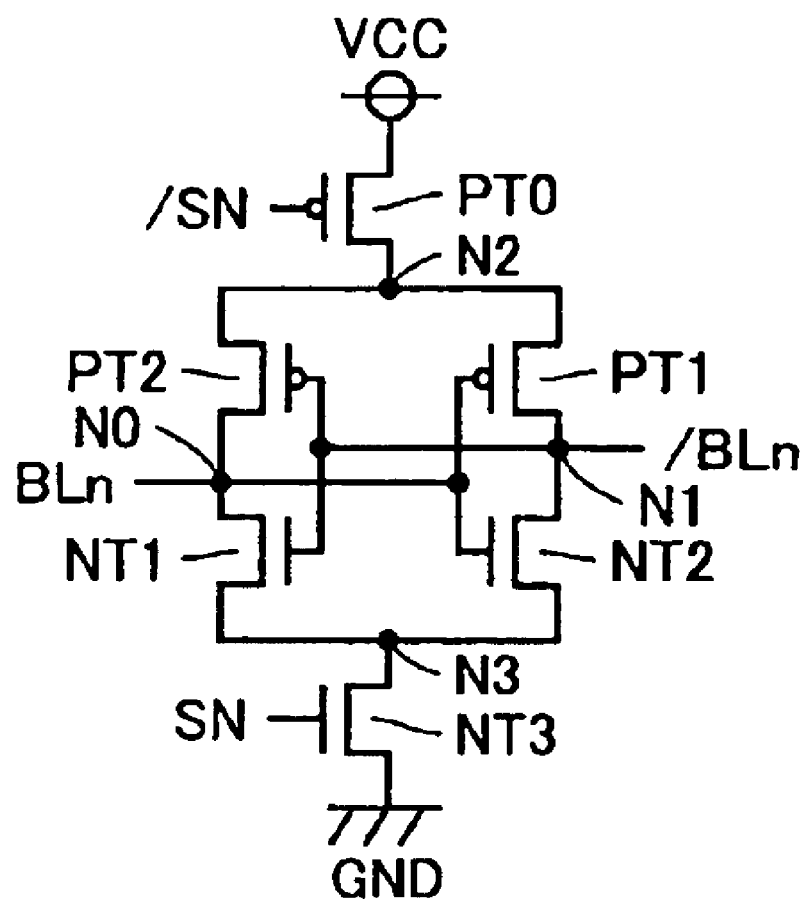
FIG. 4 is a circuit diagram of a sense amplifier.

Referring to FIG. 4, sense amplifier SAn is a so called cross coupled type sense amplifier including transistors PT0 to PT2 and NT1 to NT3. Transistor PT0 is arranged between the power supply voltage VCC and a node N2, and receives at its gate an input of control signal /SN. Transistors PT2 and NT1 are arranged between nodes N2 and N3, with their gates electrically coupled to a node N1. A node N0, to which transistors PT2 and NT1 are connected, is electrically coupled to bit line BLn. Transistors PT1 and NT2 are arranged between nodes N2 and N3, with their gates electrically coupled to node N0. Node N1, to which transistors PT1 and NT2 are connected, is electrically coupled to bit line /BLn. Transistor NT3 is arranged between node N3 and the ground voltage GND, and receives at its gate an input of control signal SN. By way of example, transistors PT0 to PT2 are P channel MOS transistors, and transistors NT1 to NT3 are N channel MOS transistors. Though a configuration of sense amplifier SAn is described as a representative, other sense amplifiers SA also have the same configuration.

An operation when sense amplifier SA is activated, that is, when control signals SN and /SN are set to the "H" level and "L" level, will be described as an example. When the potential of node N0 connected to bit line BL is higher than the potential of node N1 connected to the complementary bit line /BL, for example, transistors NT2 and PT2 turn on, and the potential difference is amplified. Specifically, node N0 is set to the "H" level (level of the power supply voltage VCC), and node N1 is set to the "L" level (level of the ground voltage GND). When the potential of node N0 connected to bit line BL is lower than the potential of node N1 connected to the complementary bit line /BL, transistors NT1 and PT1 turn on, and the potential difference is amplified. Specifically, node N1 is set to the "H" level (level of the power supply voltage VCC), and node N0 is set to the "L" level (level of the ground voltage GND).

Figure 5:
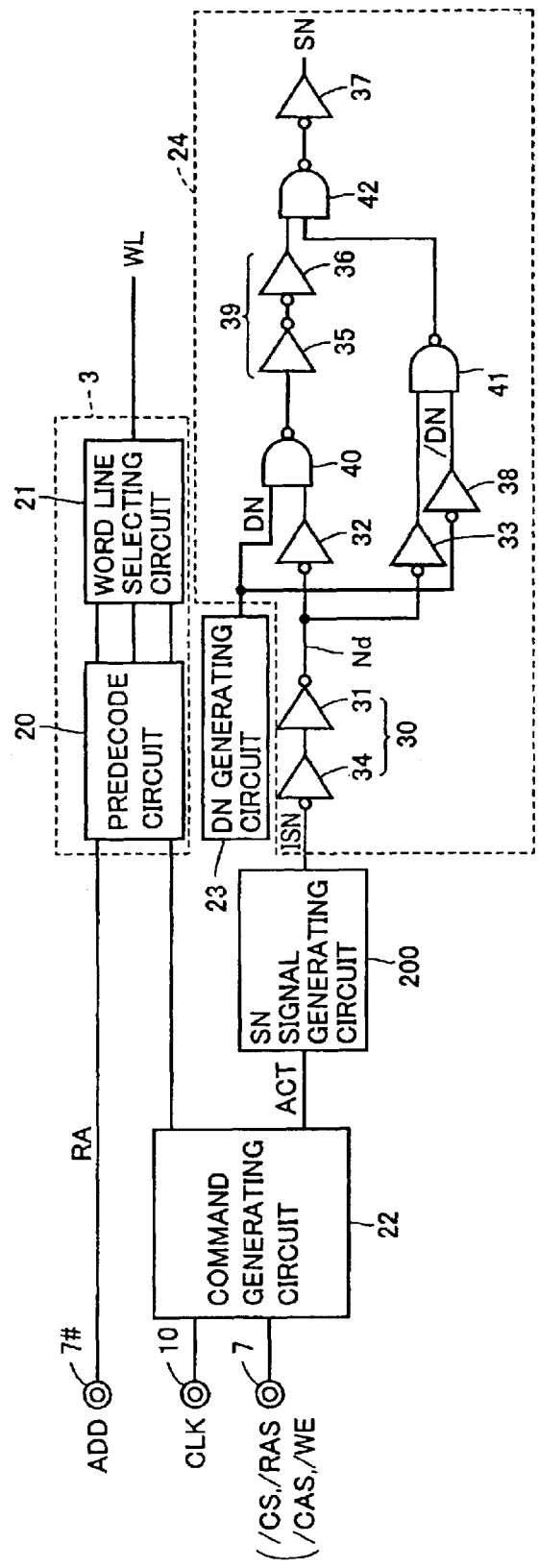
FIG. 5 is a schematic block diagram of a row selecting circuit and a control circuit in accordance with the first embodiment of the present invention.

Referring to FIG. 5, row selecting circuit 3 in accordance with the present embodiment includes a predecode circuit 20 generating a predecode signal based on the row address RA among addresses ADD input from address pin 7#, and a word line selecting circuit 21 selecting one of the plurality of word lines in accordance with the predecode signal generated by predecode circuit 20.

Figure 6:
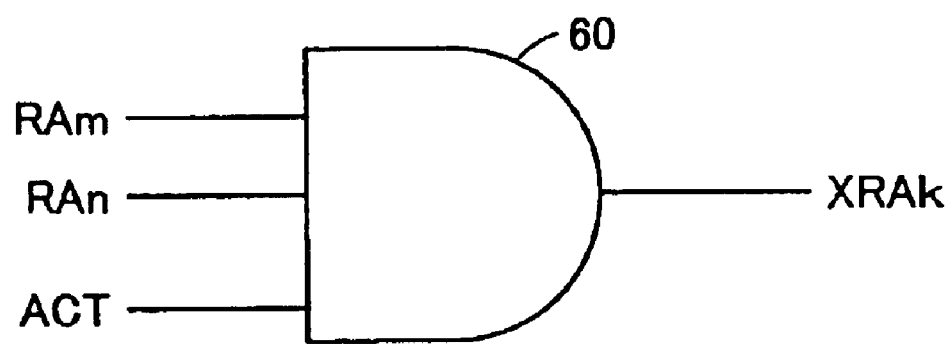
FIG. 6 shows an example of a decode unit forming a predecode circuit.

Referring to FIG. 6, a decode unit 60 forming predecode circuit 20 outputs, based on inputs of a command signal ACT from a command generating circuit 22 and row addresses Ram, Ran (m, n: natural number) that are part of bits among the plurality of bits constituting the row address RA, a result of an AND operation of these inputs as the predecode signal XRAk (k: natural number). Here, a configuration is shown in which row address RA is decoded 2 bits by 2 bits.

Figure 7:
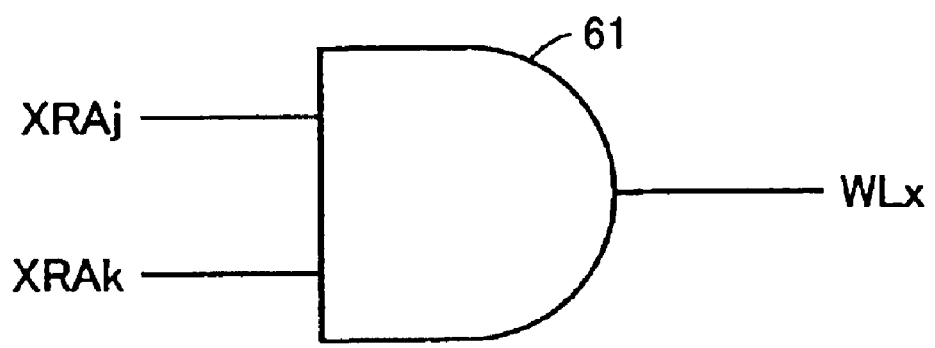
FIG. 7 shows an example of a word line selecting unit forming a word line selecting circuit.

Referring to FIG. 7, a word line selecting unit 61 forming word line selecting circuit 21 is provided for each word line WL, and activates the corresponding word line in accordance with a prescribed combination of input predecode signals.

Word line selecting unit 61 receives inputs of predecode signals XRAj and XRAk (j, k: natural number) generated by predecode circuit 20, and activates the word line WLx (x: natural number) based on the result of an AND operation thereof. Specifically, in accordance with a prescribed combination of the predecode signals, at least one of the plurality of word line selecting units activates the corresponding selected word line.

In the present configuration, the row address RA is once decoded into predecode signals several bits by several bits using predecode circuit 20, and based on the input of thus decoded predecode signals, word line selecting circuit 21 activates a selected word line among the plurality of word lines. Accordingly, as compared with a configuration in which the row address RA is decoded as it is by a decoder circuit or the like and at least one of the plurality of word lines is selected, the number of transistors used for the decoding process can be reduced. Further, by the present configuration, the time for the process of decoding the row address can be made shorter, enabling high speed row selecting operation, that is, high speed word line selecting operation.

The control circuit 2 will be described in the following.

Control circuit 2 includes a command generating circuit 22, an SN signal generating circuit 200, DN generating circuit 23, and a timing adjusting circuit 24. Command generating circuit 22 generates, in synchronization with the clock signal CLK from clock signal pin 10, a command signal instructing an operation of an internal circuit, based on a prescribed combination of control signals /CS, /RAS, /CAS and /WE input to control signal pin 7. SN signal generating circuit 200 generates a control signal ISN for activating sense amplifier SN, in response to a command signal ACT. DN generating circuit 23 (group determination circuit) outputs a control signal DN (a group determination signal) in accordance with different types of memory chips. Timing adjusting circuit 24 adjusts the timing of outputting the control signal ISN as the control signal SN. Though circuit configuration of SN signal generating circuit 200 is not shown, considering operational delay time when the internal circuit operates for data reading after the input of the command signal ACT, the control signal ISN is generated after a prescribed time period in response to the command signal ACT. As an example, a plurality of delay stages may be provided, and the timing of outputting control signal ISN may be adjusted by changing the number of delay stages to be passed through. Control signal ISN is output at the same timing in each of memory chips independent of the type of memory chips.

Figure 8A:
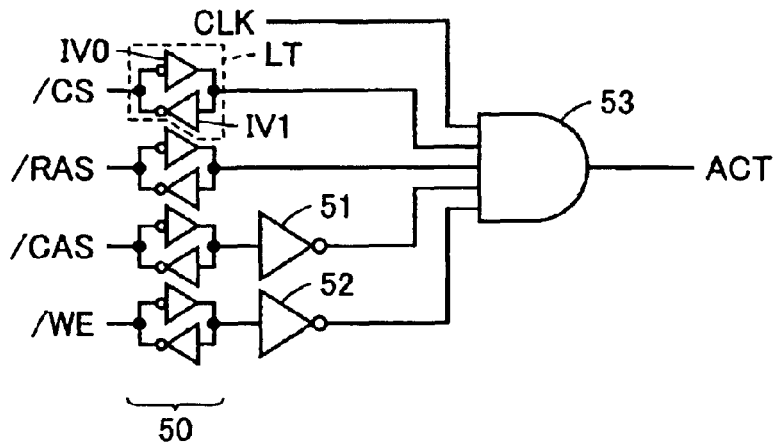
FIGS. 8A and 8B show a configuration of a command signal generating unit in a command generating circuit.

Referring to FIG. 8A, a command signal generating unit 45 generates a command signal ACT. The command signal ACT is generated in accordance with a prescribed combination of control signals externally input at the time of executing a data write operation or a data read operation.

Command signal generating unit 45 includes a group of latches 50 for latching inverted signals of input control signals /CS, /RAS, /CAS and /WE, inverters 51 and 52, and an AND circuit 53.

In the latch group 50, a latch circuit LT is provided corresponding to each of the input control signals. Latch circuit LT includes inverters IV0 and IV1 that form a ring. Latch circuit LT latches and outputs an inverted signal of the input control signal.

AND circuit 53 receives the clock signal CLK, inverted signals of control signals /CS and /RAS latched by the latch group 50 and control signals /CAS and /WE input from latch group 50 through inverters 51 and 52, and outputs a result of an AND operation thereof as the command signal ACT.

Specifically, when control signals /CS and /RAS are at the "L" level and control signals /CAS and /WE are at the "H" level, the command signal ACT ("H" level) is generated in synchronization with the rise of clock signal CLK.

Figure 8B:
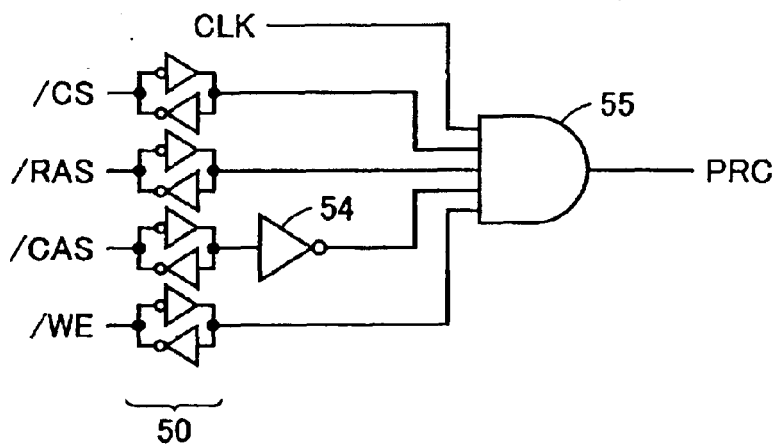

Referring to FIG. 8B, a command signal generating unit 46 generates a command signal PRC. The command signal PRC is generated in accordance with a prescribed combination of control signals externally input at the time of executing a precharge operation.

Command signal generating unit 46 includes a group of latches 50, an inverter 54 and an AND circuit 55. AND circuit 55 receives the clock signal CLK, inverted signals of control signals /CS, /RAS and /WE latched by latch group 50 and control signal /CAS input from latch group 50 through inverter 54, and outputs a result of an AND operation thereof as the command signal PRC.

Specifically, by way of example, when control signals /CS, /RAS and /WE are at the "L" level and control signal /CAS is at the "H" level, command signal PRC ("H" level) is generated in synchronization with the rise of the clock signal CLK.

Again referring to FIG. 5, timing adjusting circuit 24 will be described.

Timing adjusting circuit 24 includes inverters 31 to 38, NAND circuits 40 to 42. Inverters 31 and 34 form a delay stage 30, and inverters 35 and 36 also form a delay stage 39. Timing adjusting circuit 24 adjusts the timing of outputting control signal SN, in accordance with the logic level of the control signal generated by DN generating circuit 23.

The control signal ISN output from SN signal generating circuit 200 is transmitted through delay stage 30 to an internal node Nd. NAND circuit 40 outputs a result of an NAND operation between the control signal DN output from DN generating circuit 23 and an inverted signal of the signal transmitted to internal node Nd through inverter 32, to delay stage 39. NAND circuit 41 outputs, in response to inputs of an inverted signal of the signal transmitted to internal node Nd through inverter 33 and an inverted signal /DN of control signal DN through inverter 38, a result of an NAND operation thereof to one input node of NAND circuit 42. NAND circuit 42 outputs, in response to the inputs of the signal transmitted through delay stage 39 and an output signal of NAND circuit 41, a result of an NAND operation thereof to inverter 37. Inverter 37 inverts the output signal of NAND circuit 42 and outputs the resulting signal as the control signal SN.

Here, the operation of SN signal generating circuit 200 will be described. First, the initial state, that is, a state where the control signal ISN at the "L" level is input from SN signal generating circuit 200 will be described.

To one input node of each of NAND circuits 40 and 41, an inverted signal ("H" level) of the control signal ISN ("L" level) is input through odd-number of inverters. To the other inputs of NAND circuits 40 and 41, control signal DN and inverted signal /DN thereof are input, respectively. Therefore, either one of NAND circuits 40 and 41 sets the result of NAND operation to the "L" level in response to the input of signals both at the "H" level. Accordingly, NAND circuit 42 that outputs the result of an NAND operation between the output signal of NAND circuit 40 through delay stage 39 and the output signal of NAND circuit 41 always outputs the "H" level. Therefore, the control signal SN, which is the inversion of this signal, is always set to the "L" level. Thus, sense amplifier SA is inactive.

Next, a state in which SN signal generating circuit 200 sets the control signal ISN to the "H" level will be considered. Here, it is assumed that control signals DN and /DN are set at the "L" level and "H" level, respectively.

In the initial state, output signals of NAND circuits 40 and 41 are set to the "H" level and "L" level, respectively. In this state, when control signal ISN is set to the "H" level, the output signal of NAND circuit 40 is maintained at the "H" level, as the control signal DN is at the "L" level. On the other hand, as an inverted signal ("L" level) of the control signal ISN is input through odd-number of inverters to NAND circuit 41, the output signal of NAND circuit 41 makes a transition from "L" level to the "H" level. In response, the output signal of NAND circuit 42 is set to the "L" level. Accordingly, the control signal SN, which is the inverted signal of the output signal of NAND circuit 42, is set to the "H" level. In response to the "H" level control signal SN, the sense amplifier SA is activated. Here, the control signal SN is generated not dependent on an upper system that has the delay stage.

Next, a state will be considered in which control signals DN and /DN are set at the "H" level and "L" level, respectively.

In the initial state, output signals of NAND circuits 40 and 41 are set at the "L" level and "H" level, respectively. In this state, when control signal ISN is set to the "H" level, the output signal of NAND circuit 40 makes a transition from the "L" level to the "H" level, as an inverted signal ("L" level) of the control signal ISN is input thereto through odd-number of inverters. The output signal of NAND circuit 41 is maintained at the "H" level, as the control signal /DN is at the "L" level.

Accordingly, the control signal SN, which is the inverted signal of the output signal of NAND circuit 42 as described above, is set to the "H" level. In response to the "H" level control signal SN, sense amplifier SA is activated. Here, when the control signal DN is set at the "H" level, a signal, which is the output signal of NAND circuit 40 with the level changed from "L" level to the "H" level, is input to an input node of NAND circuit 42 through delay stage 39. Specifically, control signal SN is generated dependent on the upper system having the delay stage. Therefore, by the delay time of delay stage 39, the timing for NAND circuit 42 to output the "L" level, that is, the timing of outputting the "H" level control signal SN, is delayed.

Therefore, timing adjusting circuit 24 outputs the control signal SN at two different timings, in accordance with the logic levels of control signals DN and /DN.

Figure 9:
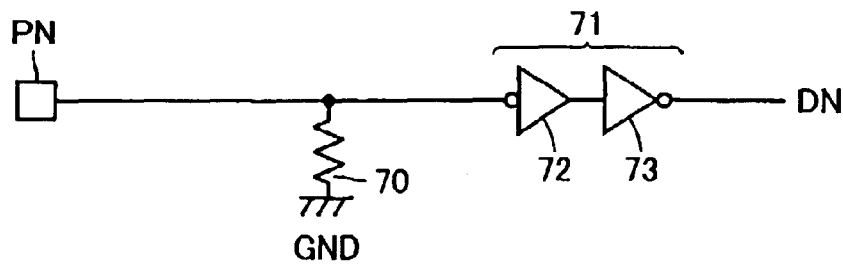
FIG. 9 is a circuit diagram of a DN generating circuit.

Referring to FIG. 9. DN generating circuit 23 includes an external pin PN, a high resistance 70, and a delay stage 71 formed by inverters 72 and 73.

The signal transmitted to external pin PN is output as control signal DN through delay stage 71. To be more specific, delay stage 71 formed by inverters 72 and 73 serves as a buffer circuit. Further, high resistance 70 is arranged between a connection node between external pin PN and delay stage 71 and the ground voltage GND.

DN generating circuit 23 generates the control signal DN in accordance with the logic level of the signal input to external pin PN. Specifically, when the logic level of the signal input to external pin PN is at the "H" level, control signal DN is set to the "H" level, and when it is "L" level, control signal DN is set to the "L" level. High resistance 70 is provided for setting the control signal DN to the "1" level when the external pin PN is at an open state. Therefore, the logic level of control signal DN can easily be controlled by the external pin.

Referring to the timing chart of FIG. 10, a data read operation in accordance with the present embodiment will be described.

Figure 10:
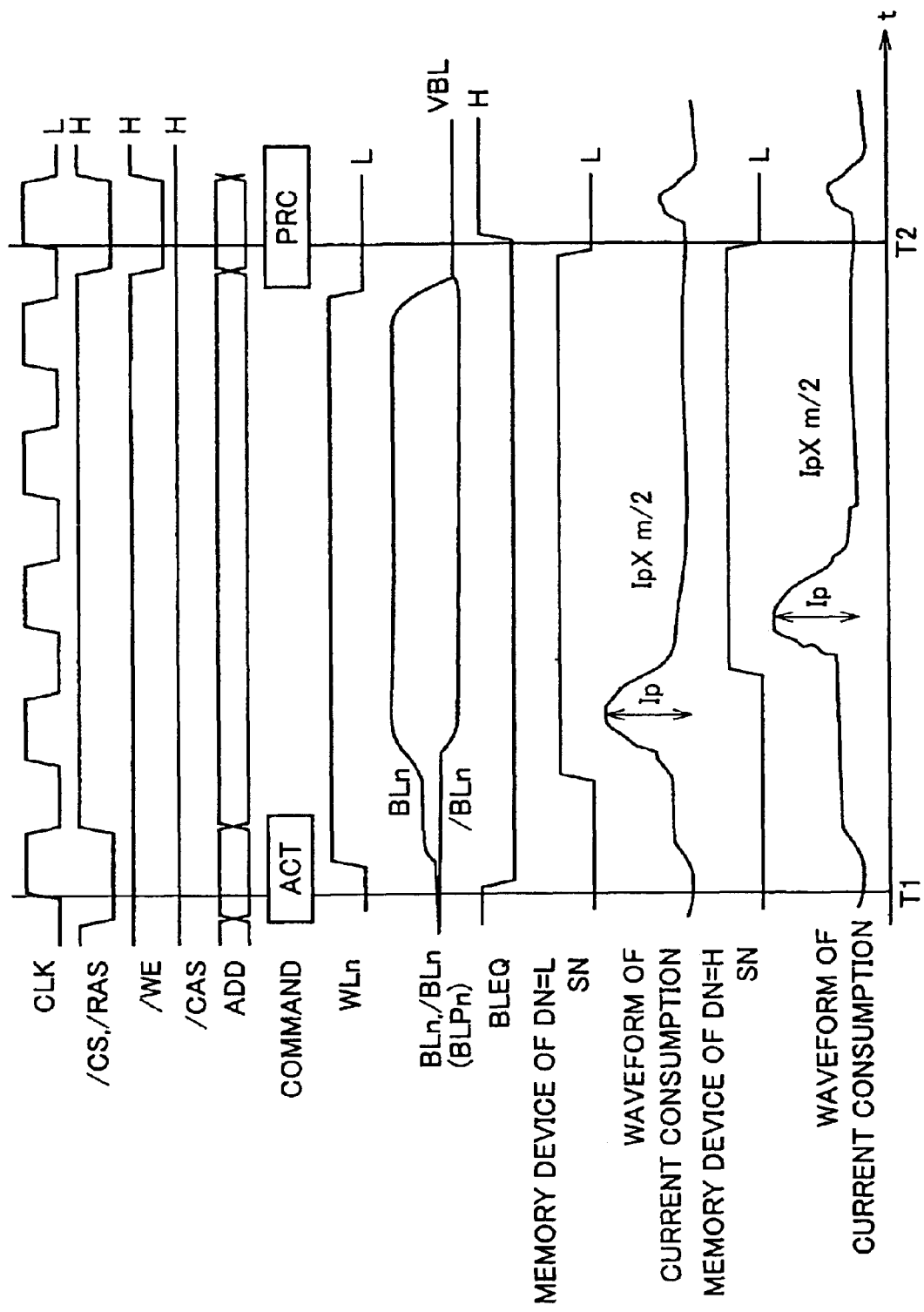
FIG. 10 is a timing chart illustrating a data read operation in accordance with the first embodiment of the present invention.

Referring to FIG. 10, at time T1, in synchronization with the rise of dock signal CLK, control signals /CS and /RAS are set to the "L" level. Control signals /WE and /CAS are set to the "H" level. Accordingly, the command signal ACT ("H" level) is generated by command generating circuit 22 as described above.

Row selecting circuit 3 generates a predecode signal based on the input of command signal ACT and the row address RA among the input address ADD, and based on the predecode signal, selects at least one of the plurality of word lines WL. In the present embodiment, a word line WLn is selected in accordance with the row address RA among the input address ADD. Further, based on the input of a column address CA, column selecting circuit 4 selects a bit line pair BLPn.

Approximately at the same timing as time T1, control signal BLEQ is set to the "L" level. Accordingly, equalization of the bit line pair BLP is terminated. Specifically, the bit line BL is electrically separated from the complementary bit line /BL, and thus, preparation for the data read operation is completed.

Next, after time T1, the selected word line WLn is activated. In response to the activation of the selected word line WLn, data reading from the memory cell MC in accordance with the stored data is executed. In accordance with the charges stored in the capacitor of selected memory cell MC, a potential difference begins to appear between the one bit line BLn and the complementary bit line /BLn of the bit line pair BLP. In the present example, because of the capacitor of selected memory cell, the potential of bit line BLn rises.

Approximately at the same timing as the potential difference begins to appear, SN signal generating circuit 200 sets the control signal ISN to the "H" level, in response to the command signal ACT ("H" level). In response, the control signal SN ("H" level) is output from timing adjusting circuit 24. Sense amplifier SAn executes an amplifying operation in response to the control signal SN, and the amplified data is transmitted to input/output line pair IOP. Accordingly, data input/output circuit 6 provides output data DQ based on the data transmitted to input/output line pair IOP, to data input/output pin 8.

Next, at time T2, in synchronization with the rise of clock signal CLK, control signals /CS, /RAS and /WE are set to the "L" level. Further, control signal /CAS is set to the "H" level. Accordingly, command signal PRC ("H" level) is generated by command signal generating unit 46. In response to the input of command signal PRC ("H" level), control signal BLEQ is set to the "H" level, by BLEQ generating circuit, not shown. Accordingly, equalizing circuit EQ is activated to equalize each of the bit line pairs BLP, and to each of the bit lines BL and /BL, the voltage VBL is supplied from VBL generating circuit 15.

Thus, preparation for the next data reading operation is executed.

In memory module 1000 in accordance with the first embodiment, two types of memory chips 1a and 1b are provided, which receive at mutually different timings the control signal SN to sense amplifiers SA. Specifically, the control signal DN is set to the "L" level for one type of memory chips, and the control signal DN is set to the "H" level for the other type of memory chips.

Therefore, a peak current flows in response to the control signal SN input at a first timing, to the memory chips in which control signal DN is set to the "L" level, while a peak current flows in response to the control signal SN input at a second timing later than the first timing, to the memory chips in which control signal DN is set to the "H" level. Specifically, in the configuration of the first embodiment, a peak current of Ip×m/2 for memory module 1000 as a whole flows at the first timing to half of m memory chips, and a peak current of Ip×m/2 for memory module 1000 as a whole flows at the second timing, to the other half.

Therefore, when memory module 1000 as a whole is considered, the maximum value of the peak current when the memory chips are operated in parallel with each other can be reduced by half.

Because of the present configuration, the maximum value of the peak current for memory module 1000 as a whole can be suppressed, and hence, malfunction in each memory chip can be prevented and stable data read operation becomes possible.

Particularly, when an excessive peak current flows to the sense amplifier SA or the like, the operation range between power supply voltage VCC and the ground voltage GND becomes narrower, making it difficult to secure sufficient operation range, increasing the possibility of malfunction. When the peak current is suppressed as in the present configuration, a stable operation range can be secured in the sense amplifier SA or the like, and highly precise sensing operation becomes possible. Further, the peak current is a high frequency noise, and therefore, it is generally suppressed by providing a decoupling capacitance. A relatively large layout area is required for the decoupling capacitance. Therefore, when the present configuration is employed, it becomes possible to reduce the decoupling capacitance and to improve efficient use of the layout area.

Though a synchronous semiconductor memory device operating in synchronization with the clock signal CLK has been described in the present embodiment, the present invention is similarly applicable to an asynchronous semiconductor memory device operating not in synchronization with the clock signal CLK.

First Modification of the First Embodiment

As a first modification of the first embodiment of the present invention, a DN signal generating circuit 23#, which can replace DN generating circuit 23, will be described.

Figure 11:
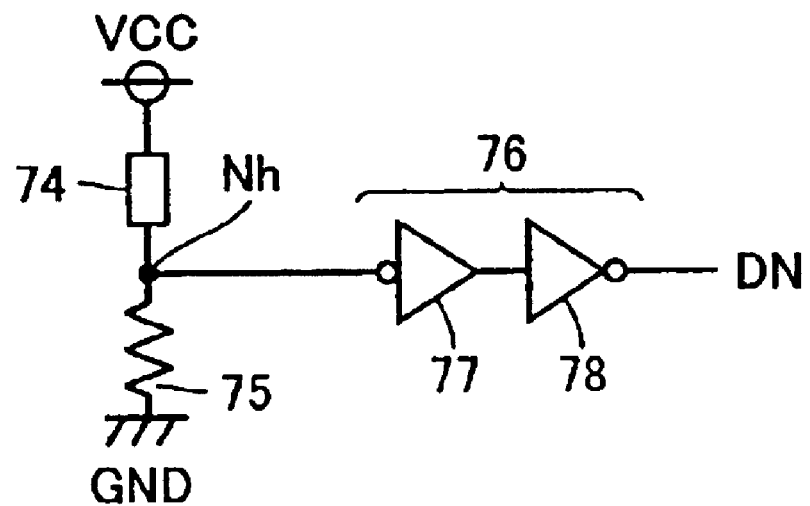
FIG. 11 is a circuit diagram of a DN generating circuit in accordance with a first modification of the first embodiment of the present invention.

Referring to FIG. 11, DN generating circuit 23# in accordance with the first modification of the first embodiment includes a fuse 74, a high resistance 75, and a delay stage formed by inverters 77 and 78. Fuse 74 is arranged between the power supply voltage VCC and a node Nh. High resistance 75 is arranged between node Nh and the ground voltage GND. A signal that has been transmitted to node Nh is output through delay stage 76 as the control signal DN.

An electric fuse that is set to an electrically blown-off (disconnected) state by an application of a high voltage, or a laser fuse that is set to an electrically blown-off state by irradiating a laser beam from the outside, may be used as fuse 74.

In a connected (not blown-off) state, the voltage level of node Nh is "H" level. Therefore, in this example, the control signal DN is set to the "H" level. When the fuse 74 is blown-off, the voltage level of node Nh is set to the "L" level by high resistance 75. Therefore, the control signal DN is set to the "L" level.

In DN generating circuit 23# in accordance with the first modification of the first embodiment of the present invention, by connecting/disconnecting the fuse using fuse 74, the control signal DN can be generated in a simple manner without using any external pin. Therefore, DN generating circuit 23# in accordance with the first modification of the first embodiment can be used effectively in a memory chip or the like of which number of external pins is limited.

Second Modification of the First Embodiment

In the first embodiment, a configuration for suppressing peak current at the time of activating sense amplifier SA, using timing adjusting circuit 24 adjusting the output timing of control signal SN for activating sense amplifier SA has been described.

In the second modification of the first embodiment, a configuration will be described, in which the peak current is suppressed in a precharge operation for precharging the bit line pairs BLP.

Figure 12:
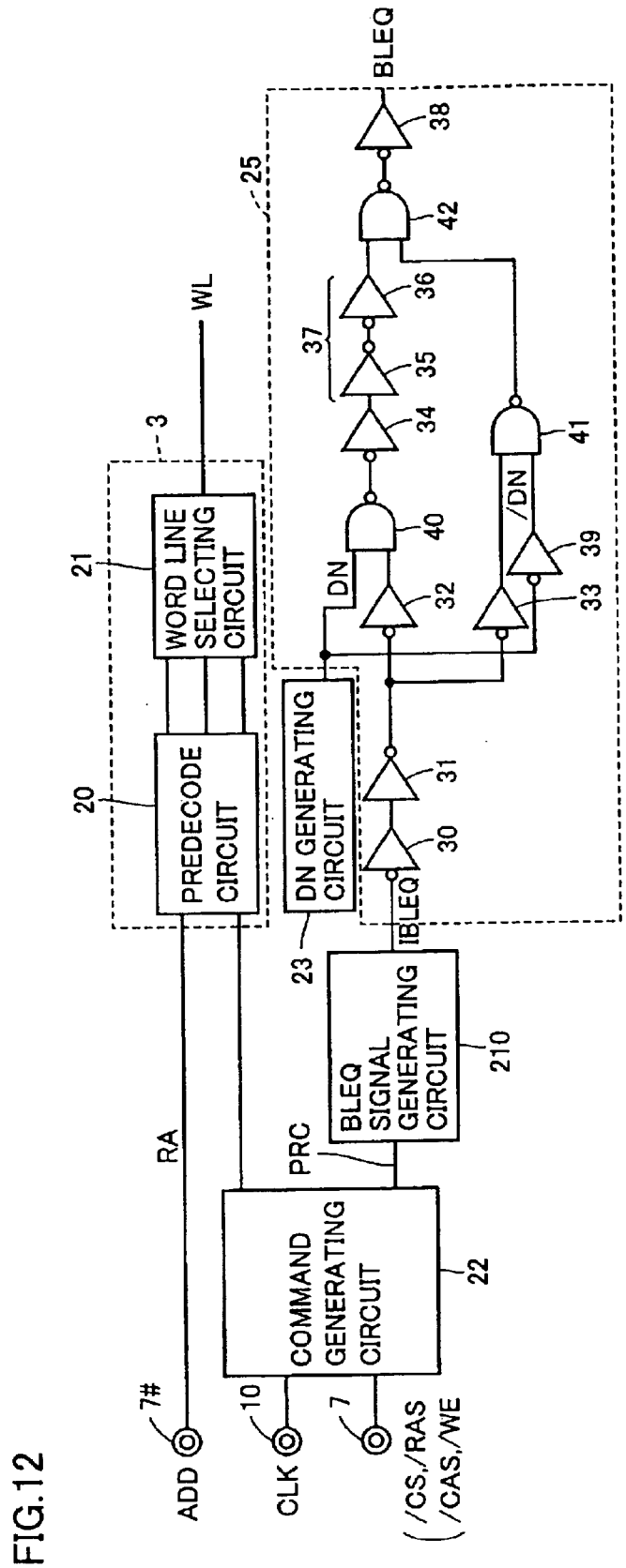
FIG. 12 is a schematic block diagram of a row selecting circuit and a control circuit in accordance with a second modification of the first embodiment of the present invention.

Referring to FIG. 12, row selecting circuit 3 in accordance with the second modification of the first embodiment is the same as that described with reference to FIG. 5, and therefore, detailed description thereof will not be repeated.

Control circuit 2 in accordance with the second modification of the first embodiment of the present invention includes a command generating circuit 22, a BLEQ signal generating circuit 210, DN generating circuit 23 and a timing adjusting circuit 25.

BLEQ signal generating circuit 210 in accordance with the second modification of the first embodiment outputs a control signal IBLEQ in response to the command signal PRC generated by command signal generating circuit 22. Specifically, in response to the input of command signal PRC ("H" level), control signal IBLEQ is set to the "H" level.

Timing adjusting circuit 25 adjusts the timing of outputting, as the control signal BLEQ, the control signal IBLEQ output from BLEQ signal generating circuit 210. The configuration of timing adjusting circuit 25 is the same as that of timing adjusting circuit 24 described above, and therefore, detailed description thereof will not be repeated. Specifically, dependent on the control signals DN and /DN generated by DN generating circuit 23, the timing of output of control signal BLEQ differs. Specifically, when the control signal DN is at the "H" level, the control signal BLEQ is output delayed, by a prescribed time period, from when the control signal DN is at the "L" level.

Therefore, by the configuration of the second modification of the first embodiment, the timing of precharging bit line pairs BLP can be adjusted using the logic level of the control signal DN.

Therefore, by making the timing of control signal BLEQ output from timing adjusting circuit 25 different in memory chips 1a and 1b, for example, the maximum value of the peak current at the precharging operation can be reduced in the memory module 1000 as a whole. Accordingly, a stable precharge operation can be executed on each bit line pair BLP. Further, as the maximum value of the peak current is suppressed, power consumption of the equalizing operation in memory module 1000 as a whole can be reduced.

Third Modification of the First Embodiment

As a third modification of the first embodiment of the present invention, a configuration for suppressing a peak current generated when a data input/output circuit 6 operates will described.

Figure 13:
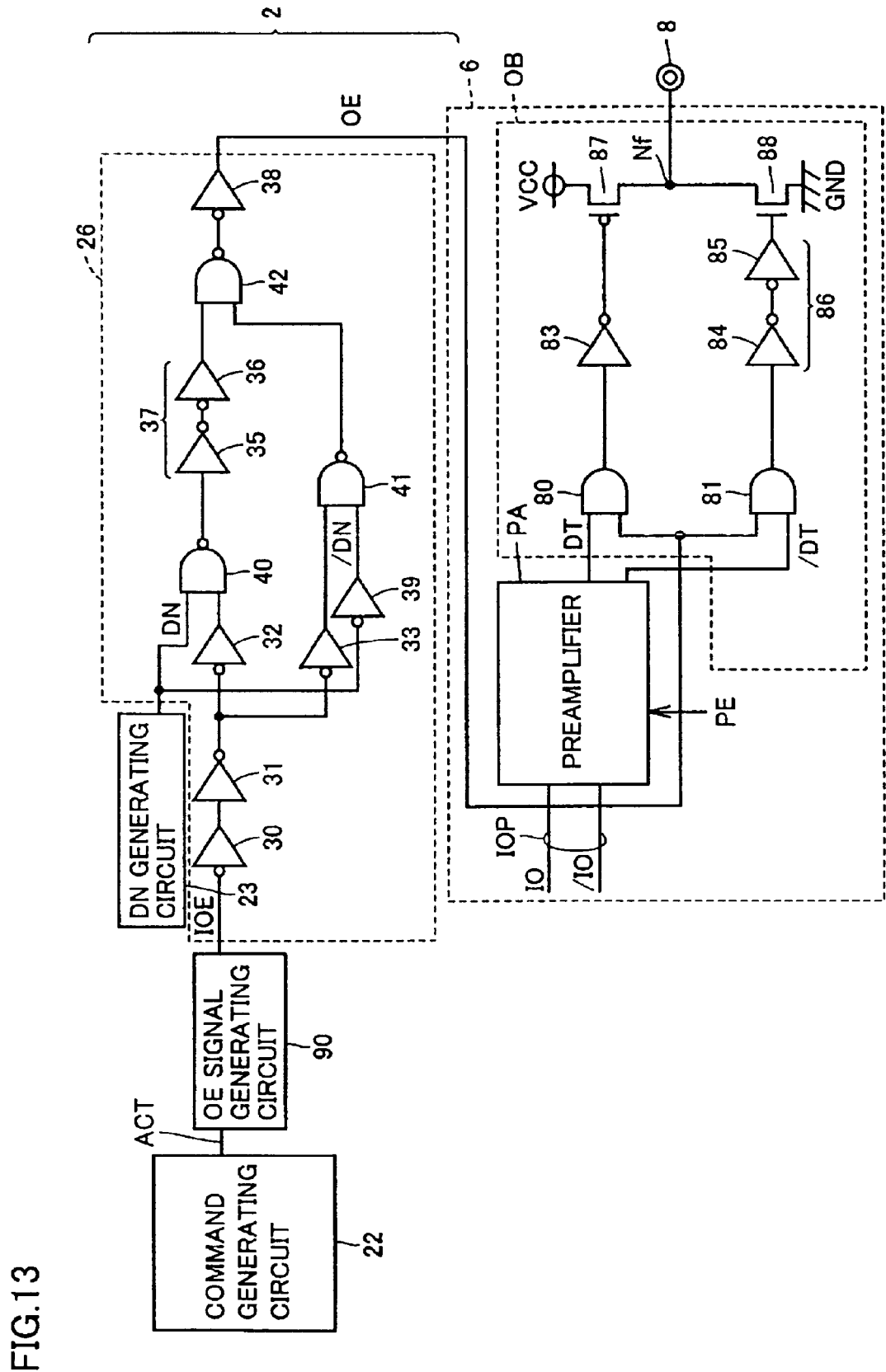
FIG. 13 is a schematic block diagram of a data input/output circuit and a control circuit in accordance with a third modification of the first embodiment of the present invention.

Referring to FIG. 13, data input/output circuit 6 in accordance with the third modification of the first embodiment of the present invention includes a preamplifier PA receiving data from input/output line pair IOP and amplifying the data in response to a control signal PE, and an output buffer OB for outputting data DT and /DT amplified by preamplifier PA as output data DQ to data input/output pin 8.

Control circuit 2 includes a command generating circuit 22, an OE signal generating circuit 90, DN generating circuit 23, and a timing adjusting circuit 26. OE signal generating circuit 90 outputs, in response to the command signal ACT generated by command generating circuit 22, a control signal IOE after a prescribed delay time. By way of example, OE signal generating circuit 90 has a plurality of delay stages, and by adjusting the number thereof in consideration of operation delay and the like of internal circuits associated with the data output operation, the timing of outputting control signal IOE is adjusted.

Timing adjusting circuit 26 adjusts the timing of outputting, as the control signal OE, the control signal IOE output from OE signal generating circuit 90. The configuration of timing adjusting circuit 26 is the same as that of timing adjusting circuit 24 described above, and therefore, detailed description thereof will not be repeated. Specifically, dependent on the control signals DN and /DN generated by DN generating circuit 23, the timing at which control signal OE is output differs. When the control signal DN is at the "H" level, the control signal OE is output delayed, by a prescribed time period, from when the control signal DN is at the "L" level.

Figure 14:
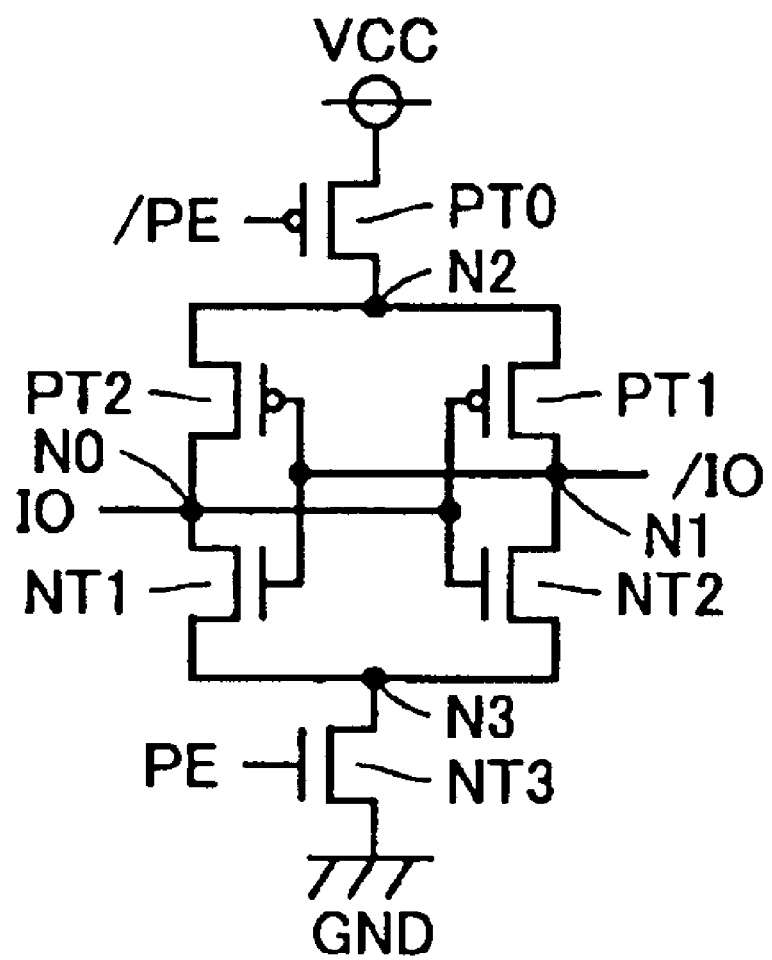
FIG. 14 shows a circuit configuration of a preamplifier.

Referring to FIG. 14, preamplifier PA has the same circuit configuration as that of sense amplifier SAn described with reference to FIG. 4. Therefore, transistors constituting the sense amplifier SAn described with reference to FIG. 4 are denoted by the same reference characters. Different from sense amplifier SAn, preamplifier PA is activated in response to control signals PE and /PE ("H" level, "L" level), and amplifies the voltage level difference between input/output lines IO and /IO.

Again referring to FIG. 13, output buffer OB includes AND circuits 80, 81, inverters 83 to 85, a P channel MOS transistor 87 and an N channel MOS transistor 88. Inverters 84 and 85 form a delay stage 86.

AND circuit 80 receives the voltage level of one input/output line of input/output line pair IOP amplified by preamplifier PA, as data DT, and the control signal OE, and outputs the result of an AND operation of these inputs to inverter 83. AND circuit 81 receives the voltage level of the other input/output line of input/output line pair IOP amplifed by preamplifier PA, as data /DT, and the control signal OE, and outputs the result of an AND operation of these inputs to delay stage 86. Transistor 87 is arranged between power supply voltage VCC and output node Nf, and receives at its gate the output signal of inverter 83. Transistor 88 is arranged between output node Nf and the ground voltage GND, and receives at its gate the output signal of delay stage 86.

The operation of output buffer OB will be described.

Consider that output buffer OB is at an active state, that is, control signal OE is set at the "H" level. When data DT and /DT are at the "H" level and "L" level, AND circuits 80 and 81 are set to "H" level and "L" level, respectively. In response, "L" level and "H" level are input to the gates of transistors 87 and 88, respectively. Accordingly, transistor 87 turns on, output node Nf is electrically coupled to power supply voltage VCC, and output data DQ of "H" level is output to data input/output pin 8.

When data DT and /DT are at the "L" level and "H" level, in the similar manner, "H" level and "L" level are input to the gates of transistors 87 and 88. Accordingly, transistor 88 turns on, output node Nf is electrically coupled to the ground voltage GND, and output data DQ of "L" level is output to data input/output pin 8.

In the third modification of the first embodiment of the present invention, the timing of outputting control signal OE for activating output buffer OB is adjusted in accordance with the logic level of control signal DN.

By way of example, by making the timing of control signal OE output from timing adjusting circuit 26 different in memory chips 1a and 1b, the maximum value of peak current at the time of a data output operation in memory module 1000 as a whole can be suppressed. Therefore, a stable circuit operation becomes possible without causing any malfunction at the time of the data output operation. Further, as the maximum value of the peak current is suppressed, the power consumption of data output operation in memory module 1000 as a whole can be reduced.

Figure 15:
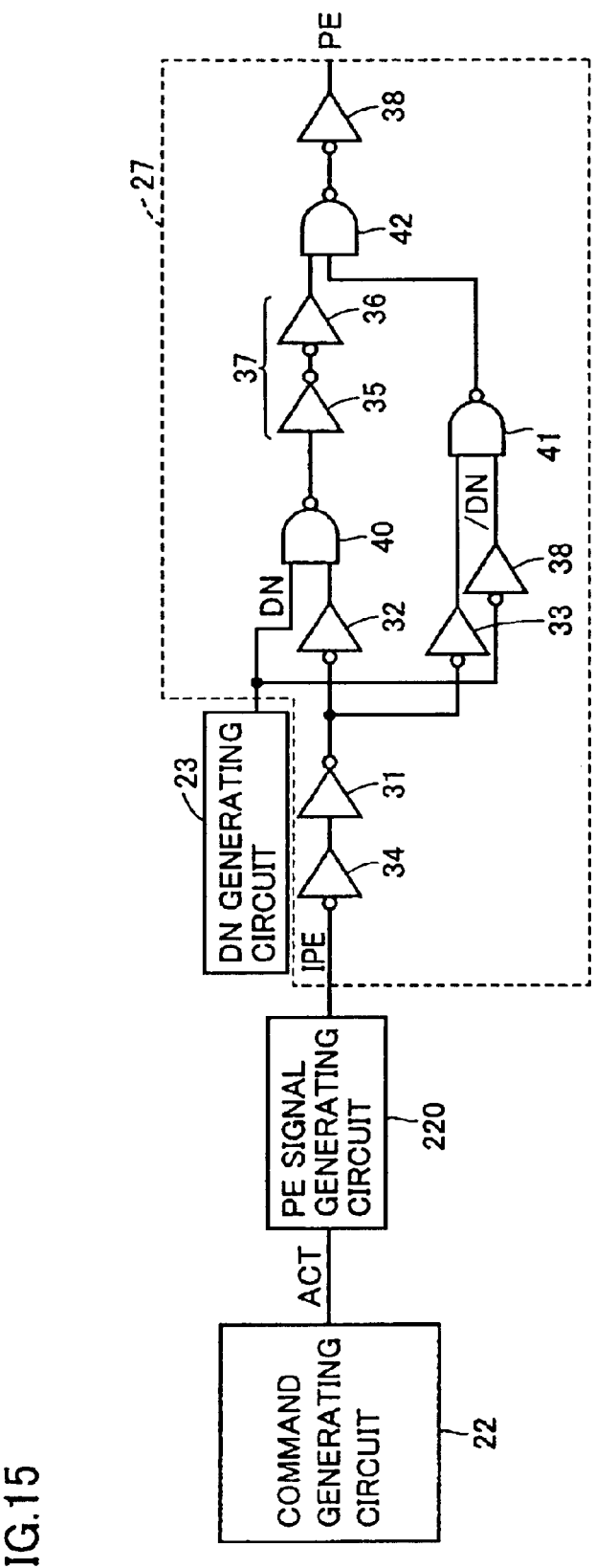
FIG. 15 is a schematic block diagram of a control circuit that outputs a control signal for activating the preamplifier.

Referring to FIG. 15, control circuit 2 outputting a control signal PE for activating preamplifier PA includes a command generating circuit 22, a PE signal generating circuit 220, DN generating circuit 23, and a tiling adjusting circuit 27.

PE signal generating circuit 220 outputs, in response to the command signal ACT generated by command generating circuit 22, a control signal IPE delayed by a prescribed time period. By way of example, PE signal generating circuit 220 has a plurality of delay stages, and adjusts the timing of outputting the control signal PE by adjusting the number thereof, in consideration of operation delay of internal circuits associated with the data output operation.

Timing adjusting circuit 27 adjusts the timing of outputting, as the control signal PE, the control signal IPE output from PE signal generating circuit 220. The configuration of timing adjusting circuit 27 is the same as that of timing adjusting circuit 24 described above, and therefore, description thereof will not be repeated. Specifically, the output timing of control signal PE differs dependent on the control signals DN and /DN generated by DN generating circuit 23. When the control signal DN is at the "H" level, the control signal PE is output delayed, by a prescribed time period, from when the control signal DN is at the "L" level.

Accordingly, by making the timing of control signal PE output from timing adjusting circuit 27 different in memory chips 1a and 1b, the maximum value of peak current at the time of a preamplifing operation in memory module 1000 as a whole can be suppressed. Therefore, a stable amplifying operation becomes possible without causing any malfunction. Specifically, as the peak current is suppressed as in the operation of the sense amplifier SA, a sufficient operation range can be secured. Further, as the maximum value of the peak current is suppressed, power consumption in the data output operation in memory module 1000 as a whole can be reduced.

Fourth Modification of the First Embodiment

In the first embodiment and modification thereof, configuration of a sense amplifier, preamplifier, output buffer and precharge circuit, each one provided in a DN generating circuit, and differentiating the timing of activating the activation signal in accordance with control signal DN corresponding to the types of memory chips has been described.

In the fourth modification of the first embodiment, a case will be described, in which the timing of activating the activation signal in accordance with control signal DN corresponding to types of memory chips is differentiated by providing a common DN generating circuit.

Figure 16:
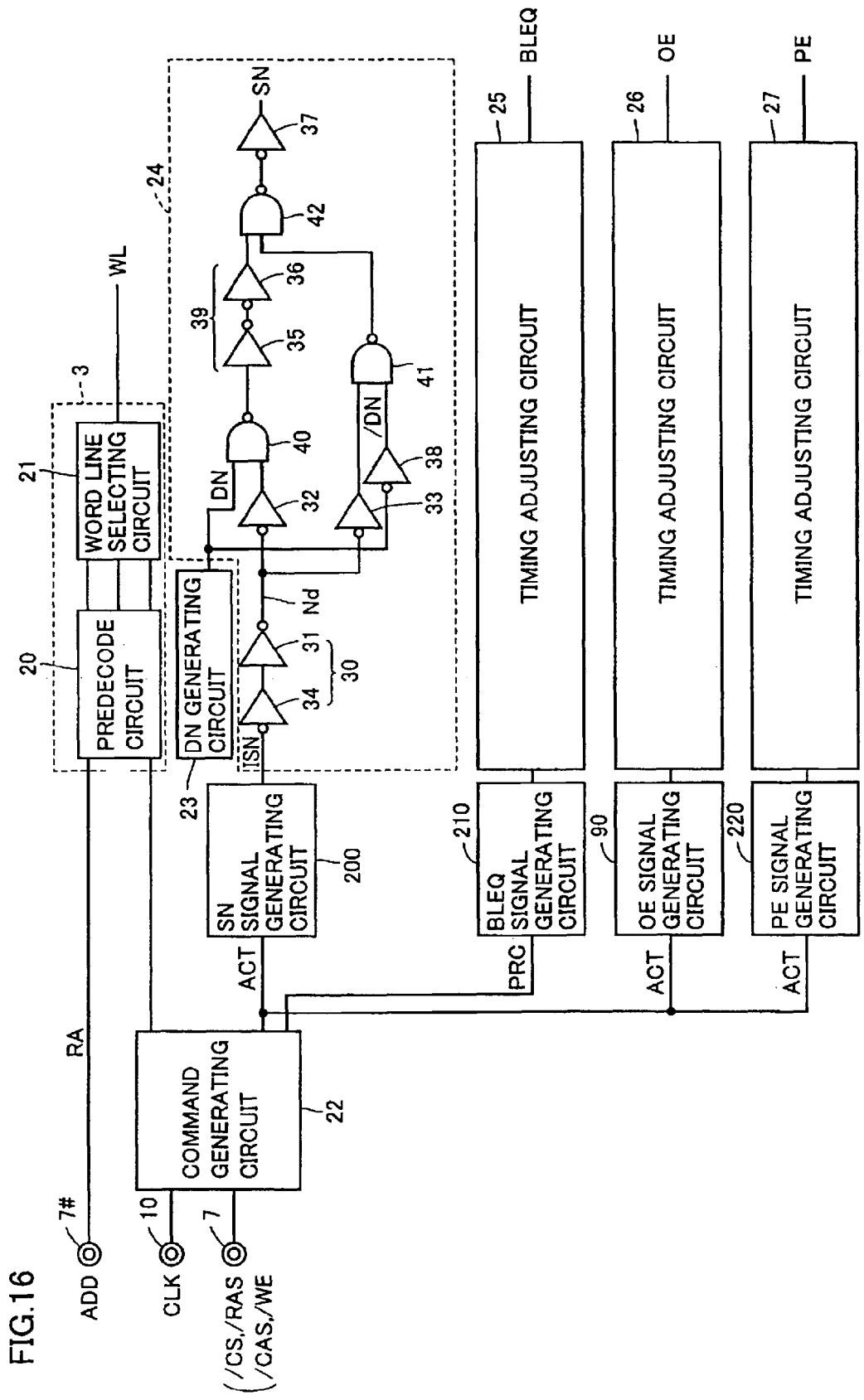
FIG. 16 is a schematic block diagram of a row selecting circuit and a control circuit in accordance with a fourth modification of the first embodiment of the present invention.

Referring to FIG. 16, row selecting circuit 3 in accordance with the fourth modification of the first embodiment is the same as that described with reference to FIG. 5, and therefore, detailed description thereof will not be repeated.

Control circuit 2 in accordance with the fourth modification of the first embodiment of the present invention includes command generating circuit 22, SN signal generating circuit 200, BLEQ signal generating circuit 210, OE signal generating circuit 90, PE signal generating circuit 220, DN generating circuit 23, and timing adjusting circuit 24–27.

SN signal generating circuit 200, BLEQ signal generating circuit 210, OE signal generating circuit 90, and PE signal generating circuit 220 are the same as those described above, and therefore, detailed description thereof will not be repeated. Also, timing adjusting circuits 24–27 are the same as those described above, and therefore, detailed description thereof will not be repeated.

In the present modification, one example is that a DN generating circuit generating control signal DN (a group determination signal) provided to timing adjusting circuit 24–27 is provided in common, that is the DN generating circuit is shared. Therefore, each of signal generating circuits adjusts the timing of activating the activation signal in response to a control signal DN applied at a time of a prescribed operation as described above. That is, the timing of activating the activation signal by a common DN generating circuit 23 is different respectively corresponding to the types of memory chips 1a, 1b.

Accordingly, the maximum value of the peak current at the prescribed operation can be reduced in the entire memory module 1000. Further, the area of circuits occupying memory module can be reduced by common DN generating circuit 23.

In this modification, a system having a common DN generating circuit provided and adjusting a timing of activating the activation signal have been described. However, this is exemplary. A DN generating circuit can be provided corresponding to a prescribed a signal generate circuit group(example of SN signal generating circuit 200 and PE signal generating circuit 220). Furthermore, one DN generating circuit can be provided corresponding to one signal generating circuit as described above.

Second Embodiment

In the second embodiment, a configuration will be described, which suppresses the peak current at the time of an auto refresh operation (hereinafter simply referred to as a refresh operation) of a memory bank where the memory array 5 of memory chip 1a (1b) includes a plurality of memory banks MB.

Figure 17:
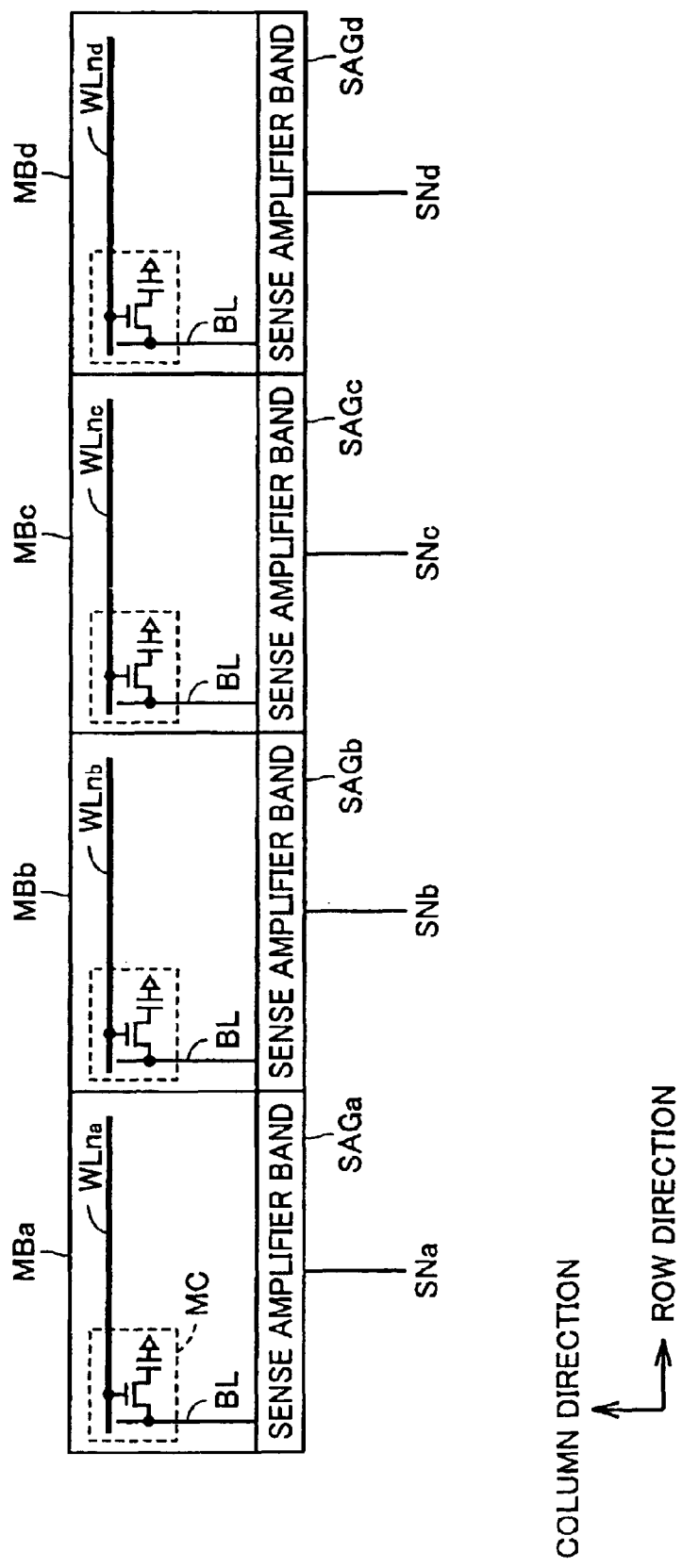
FIG. 17 is a schematic block diagram of a configuration in accordance with a second embodiment in which a plurality of memory banks are arranged.

Referring to FIG. 17, the configuration of the second embodiment having a plurality of memory banks MB arranged therein includes four memory banks MBa to MBd, and sense amplifier bands SAGa to SAGd corresponding to memory banks MBa to MBd, respectively. Memory bank MB generally refers to the memory banks MBa to MBd. Sense amplifier band SAG generally refers to sense amplifier bands SAGa to SAGd.

Each memory bank MB has the same configuration as memory array 5 described with reference to FIG. 3. In FIG. 17, one memory cell MC is shown for each memory bank MB, and in memory banks MBa to MBd, word lines WLna, WLnb, WLnc and WLnd provided corresponding to nth row of memory cells and bit lines BL provided corresponding to columns of memory cells, represented by one bit line in each bank, are shown.

Each of sense amplifier bands SAGa to SAGd has a plurality of sense amplifiers SA similar to those described with reference to FIG. 3. The sense amplifier SA included in each of the sense amplifier bands SAGa to SAGd executes a sensing operation in the corresponding memory bank MB, in response to control signals SNa to SNd, respectively.

The refresh operation will be described.

Data storage in a memory cell MC of a DRAM is realized by storing charges in a capacitor Cp in the memory cell. Therefore, in a prescribed time period, the stored charges leak and are lost. Therefore, a refresh operation must be executed in the prescribed time period for holding the charges. In the refreshing operation, in each of the memory cells as an object of refreshing, data reading, amplification and rewriting are executed in the prescribed time period, to retain the stored data. In the configuration of the second embodiment, at the time of a refresh operation, all the memory cells connected to a word line selected in accordance with the row address are refreshed simultaneously in each of the memory banks MBa to MBd. For example, in the refresh operation, all the word lines WLna to WLnd in memory banks MBa to MBd, respectively, are activated in parallel.

Though not shown, in the configuration of the second embodiment, a row selecting circuit 3 is arranged in each memory bank MB, and each row selecting circuit 3 activates, in response to the input address ADD, the word line WLna (WLb, WLc, WLd) in the corresponding memory bank MB.

Figure 18:
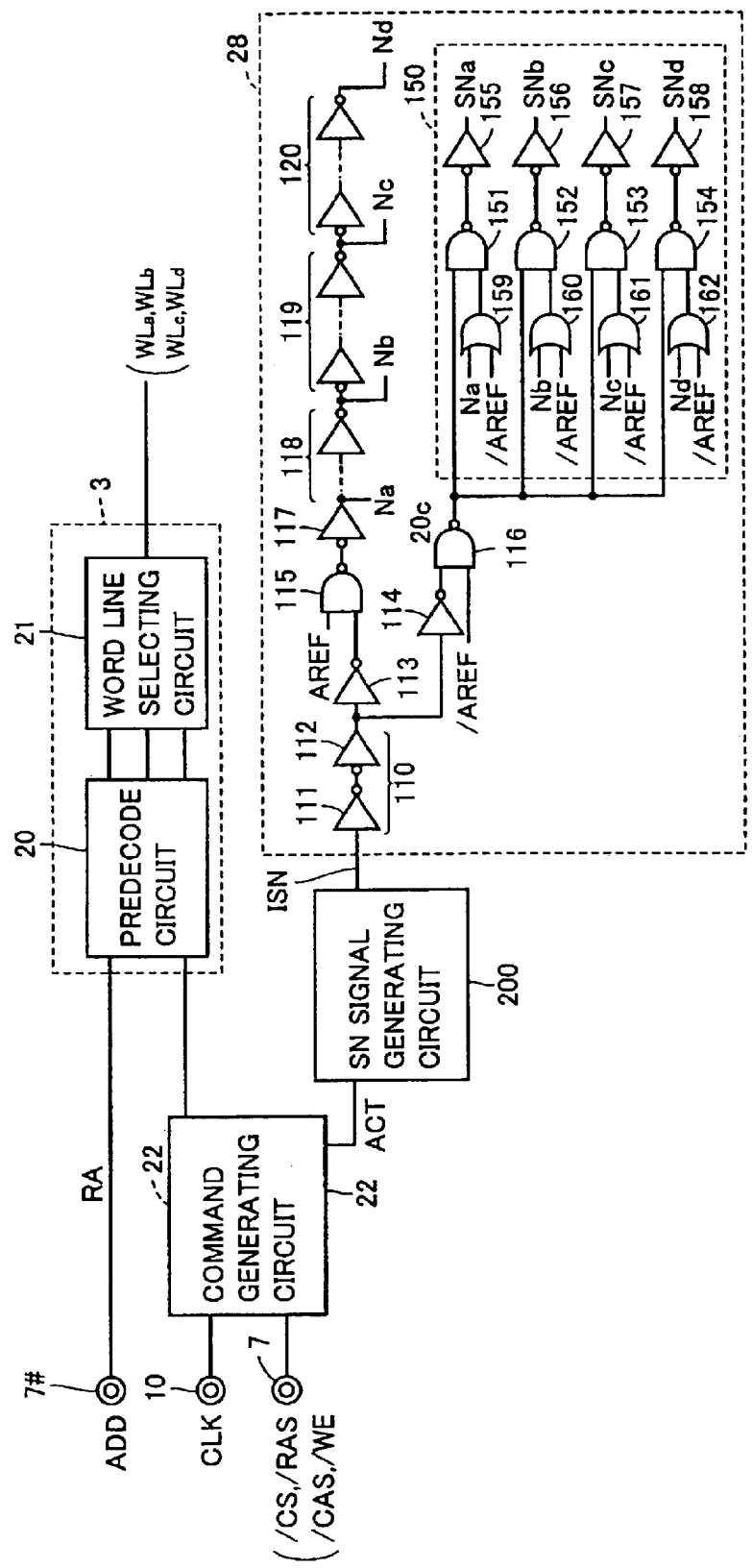
FIG. 18 is a schematic block diagram representing configurations of a control circuit and a row selecting circuit in accordance with the second embodiment of the present invention.

Referring to FIG. 18, control circuit 2 includes a command generating circuit 22, an SN signal generating circuit 200 and a timing adjusting circuit 28.

SN signal generating circuit 200 is the same as that described with reference to the first embodiment above, and therefore, description thereof will not be repeated.

Figure 19:
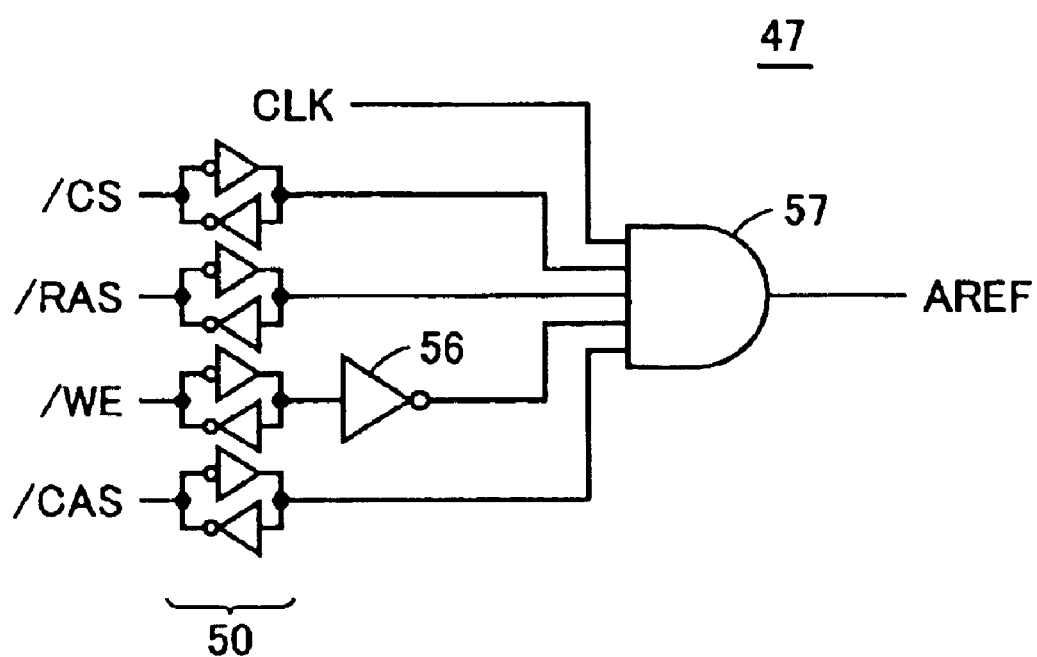
FIG. 19 is a circuit diagram of a command signal generating unit generating a command signal.

Referring to FIG. 19, a command signal generating unit 47 includes a group of latches 50, an inverter 56 and an AND circuit 57. A command signal AREF is generated in accordance with a prescribed combination of control signals externally input at the time of executing an auto refresh operation.

AND circuit 57 receives a clock signal CLK, inverted signals of control signals /CS, /RAS and /CAS latched by latch group 50 and an input of control signal /WE from latch group 50 through inverter 56, and outputs the result of an AND operation thereof as the command signal AREF ("H" level).

Specifically, when control signals /CS, /RAS and /CAS are at the "L" level and control signal /WE is at the "H" level, the command signal AREF is generated in synchronization with the rise of clock signal CLK.

Again referring to FIG. 18, timing adjusting circuit 28 in accordance with the second embodiment adjusts the refresh tiling in each memory bank MB.

Timing adjusting circuit 28 includes inverters 111 to 114 and 117, delay stages 118 to 120, NAND circuits 115 and 116, and a signal generating unit 150. Inverters 111 and 112 form a delay stage 110.

The control signal ISN generated by SN signal generating circuit 200 is input to one input node of NAND circuit 115 through delay stage 110 and inverter 113. NAND circuit 115 receives the command signal AREF and an output signal from inverter 113, and outputs the result of an NAND operation of these signals to inverter 117. Inverter 117 inverts the output signal from NAND circuit 115 and transmits the inverted signal to an internal node Na. Delay stage 118 delays by a prescribed delay time the signal that has been transmitted to internal node Na and transmits the delayed signal to an internal node Nb. Delay stage 119 delays and transmits the signal that has been transmitted to internal node Nb to an internal node Nc. Delay stage 120 delays by a prescribed delay time the signal that has been transmitted to internal node Nc and transmits the delayed signal to an internal node Nd. NAND circuit 116 receives an input of the inverted signal of control signal ISN through delay stage 110 and inverter 114 and an input of command /AREF, and outputs the result of an NAND operation of these inputs to signal generating unit 150.

Signal generating unit 150 includes NAND circuits 151 to 154, inverters 155 to 158, and OR circuits 159 to 162.

OR circuit 159 outputs a result of an OR operation of the signal that has been transmitted to internal node Na and the command signal /AREF to one input node of NAND circuit 151. OR circuit 160 outputs a result of an OR operation of the signal that has been transmitted to internal node Nb and the command signal /AREF to one input node of NAND circuit 152. OR circuit 161 outputs a result of an OR operation of the signal that has been transmitted to internal node Nc and the command signal /AREF to one input node of NAND circuit 153. OR circuit 162 outputs a result of an OR operation of the signal that has been transmitted to internal node Nd and the command signal /AREF to one input node of NAND circuit 154.

NAND circuit 151 outputs a result of an NAND operation of output signals of NAND circuit 116 and OR circuit 159. Inverter 155 provides the inverted signal of output signal of NAND circuit 151 as control signal SNa. NAND circuit 152 outputs a result of an NAND operation of output signals of NAND circuit 116 and OR circuit 160. Inverter 156 provides the inverted signal of output signal of NAND circuit 152 as control signal SNb. NAND circuit 153 outputs a result of an NAND operation of output signals of NAND circuit 116 and OR circuit 161. Inverter 157 provides the inverted signal of output signal of NAND circuit 153 as control signal SNc. NAND circuit 154 outputs a result of an NAND operation of output signals of NAND circuit 116 and OR circuit 162. Inverter 158 provides the inverted signal of output signal of NAND circuit 154 as control signal SNd.

Next, the operation of timing adjusting circuit 28 will be described. It is assumed that command signals AREF and /AREF are set to the "L" level and "H" level in the initial state.

When control signal ISN is at the "L" level, that is, in the initial state, the "H" level is input to one input node of NAND circuit 116 through odd-number of inverters. The command signal /AREF is at the "H" level. Therefore, the output signal of NAND circuit 116 is set to the "L" level. Accordingly, NAND circuits 151 to 154 of signal generating unit 150 set the control signals SNa to SNd to the "L" level, respectively. Therefore, sense amplifiers SA in respective sense amplifier bands SAG are set to the inactive state.

When the control signal ISN is at the "H" level, "L" level is input to one input of NAND circuit 116. Consequently, the output signal of NAND circuit 116 is set to the "H" level. NAND circuits 151 to 154 of signal generating unit 150 receive the output signal ("H" level) of NAND circuit 116 and command signal /AREF ("H" level), and therefore, set the control signals SNa to SNd to the "H" level. Therefore, sense amplifiers SA in respective sense amplifier bands SAG are set to the active state.

Next, consider an example in which command signals AREF and /AREF are set to the "H" level and "L" level, respectively.

As descried above, in the initial state, one input node of NAND circuit 115 is set to the "H" level. Therefore, based on the result of an NAND operation of the command signal AREF ("H" level) and the output signal of inverter 113 ("H" level), NAND circuit 115 outputs the "L" level. Accordingly, the voltage level of the internal node is set to the "H" level through inverter 117. Further, the "H" level signal is transmitted to other internal nodes Nb to Nd, delayed by a prescribed time period for each node, through delay stages 118 to 120.

The command signal /AREF ("L" level) is input to the input node of NAND circuit 116. Therefore, signal generating unit 150 receives an input signal of "H" level from NAND circuit 116. NAND circuits 151 to 154 set, based on the output signal ("H" level) of NAND circuit 116 and output signals of OR circuits 159 to 162, that is, delayed signals ("H" level) transmitted to respective internal nodes Na to Nd, the control signals SNa to SNd to "H" level. At this time, there arises a timing difference of a prescribed time period between each of the control signals SNa to SNd, because of the delayed signals transmitted to respective input nodes Na to Nd.

The refresh operation in accordance with the second embodiment of the present invention will be described with reference to the timing chart of FIG. 20. In this example, it is assumed that word lines WLna, WLnb, WLnc and WLnd are selected.

Figure 20:
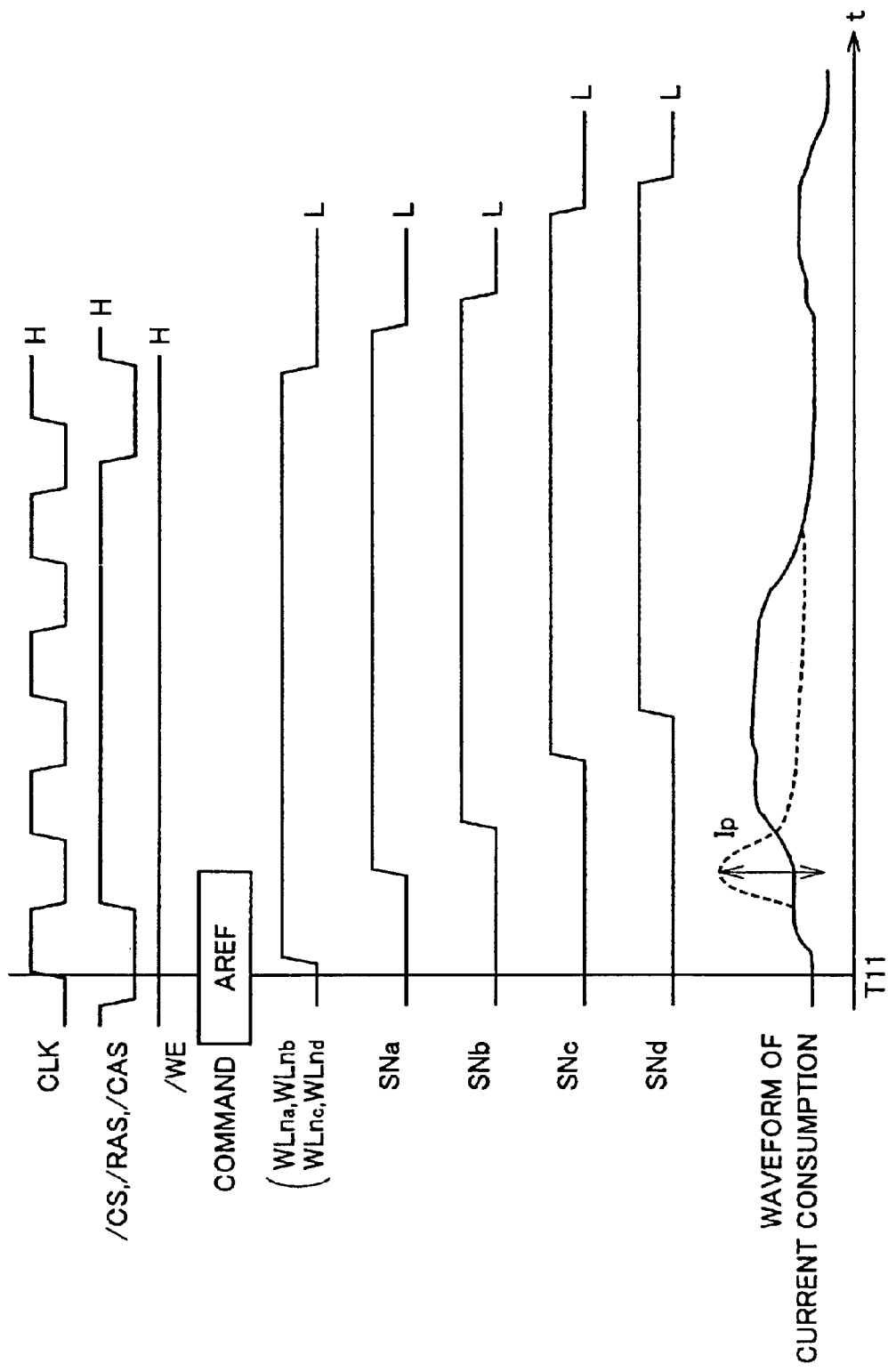
FIG. 20 is a timing chart representing a refresh operation in accordance with the second embodiment of the present invention.

Referring to FIG. 20, at time T11, control signals /CS, /RAS and /CAS are set to the "L" level, in synchronization with the rise of clock signal CLK. The control signal /WE is set to the "H" level. Command signal generating unit 47 generates a command signal AREF ("H" level).

At the same tiring, row selecting circuit 3 activates the word lines WLna, WLnb, WLnc and WLnd of the selected row, in response to the input address ADD, though not shown.

Accordingly, the capacitor of a memory cell of the selected row is electrically coupled to the bit line BL. When the sense amplifier SA in the sense amplifier band SAG is activated in this state, the data that has been stored in the capacitor is rewritten, that is, refreshed.

As described above, in timing adjusting circuit 28 in accordance with the second embodiment of the present invention, control signals SNa, SNb, SNc and SNd are set to the "H" level by the input of command signal AREF and output at timings different from each other.

Therefore, by generating the command signal AREF, the control signal SNa, SNb, SNc and SNd, which are sense amplifier activating signals, are input to respective sense amplifier bands at mutually different timings. Therefore, as compared with an example in which the control signals are input simultaneously to the sense amplifier bands as represented by the dotted line in the figure, the peak current at the time of a refresh operation of a memory chip can be suppressed.

As the peak current at the time of a refresh operation of a memory chip can be suppressed, a stable refresh operation becomes possible. Further, power consumption in the refresh operation can also be reduced.

Though one memory chip has been described in the present embodiment, the present invention is similarly applicable to other memory chips.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a plurality of memory chips formed on one board, each executing data storage independently, and operating in parallel a data read operation; wherein said plurality of memory chips are divided into first and second groups, each of said memory chips comprises a memory array having a plurality of memory cells arranged in a matrix of rows and columns, and a plurality of bit lines corresponding to the memory cell columns, a precharge circuit activated before data reading to precharge said bit lines to a prescribed voltage, a sense amplifier activated at the time of said data reading to amplify data stored in said plurality of memory cells, and a preamplifier activated at the time of said data reading to further amplify the data that has been amplified by said sense amplifier, an output buffer activated at the time of said data reading to output said stored data amplified by said preamplifier, and an activation signal generating unit generating an activation signal based on a command input for activating at least one of said precharge circuit, said sense amplifier, said preamplifier, and said output buffer, said activation signal generating unit includes a common activation signal generating circuit generating a common activation signal based on said command input at the same timing independent of which group the memory chip belongs to, a group determination circuit generating a group determination signal for determining which group the memory chip belongs to, and a timing control circuit generating said activation signal based on said group determination signal and said common activation signal at the timing corresponding to said belonging group.

2. The semiconductor memory device according to claim 1, wherein said activation signal generating unit includes a command generating circuit designating a prescribed operation in each of said memory chips in accordance with said command input, a sense amplifier activation signal generating unit generating a signal activating said sense amplifier in response to a signal output from said command generating circuit, a preamplifier activation signal generating unit generating a signal activating said preamplifier in response to a signal output from said command generating circuit, an output buffer activation signal generating unit generating a signal activating said output buffer in response to a signal output from said command generating circuit, and a precharge circuit activation signal generating unit generating a signal activating said precharge circuit in response to a signal output from said command generating circuit, each of said sense amplifier activation signal generating unit, said preamplifier activation signal generating unit, said output buffer activation signal generating unit and said precharge circuit activation signal generating unit has said common activation signal generating circuit, said group determination circuit and said timing control circuit, and outputs the corresponding activation signal.

3. The semiconductor memory device according to claim 1, wherein said group determination circuit includes an external pin and a buffer circuit, and generates said group determination signal in response to an input signal input from said external pin.

4. The semiconductor memory device according to claim 1, wherein said group determination circuit includes a fuse element, and generates said group determination signal in accordance with connection/disconnection of said fuse element.

* * * * *